United States Patent [19]

Sylviane et al.

[11] Patent Number: 4,808,919

[45] Date of Patent: Feb. 28, 1989

[54] ADJUSTABLE DEVICE FOR MEASURING THE CHARACTERISTICS OF A MICROWAVE COMPONENT

[75] Inventors: Bitoune Sylviane, Igny; Francois Grossier, Limours; Maurice LeCreff, Garches; Gérard Ralala, Evry; Dominique Geffroy, Courcouronnes, all of France

[73] Assignee: Thomson Hybrides et Microondes, Paris, France

[21] Appl. No.: 135,232

[22] Filed: Dec. 21, 1987

[30] Foreign Application Priority Data

Dec. 23, 1986 [FR] France .................. 86 18087

[51] Int. Cl.$^4$ ............................ G01R 31/02
[52] U.S. Cl. .................. 324/158 F; 333/246; 333/260
[58] Field of Search .................. 333/245–247, 333/260, 33; 324/158 F, 58 A

[56] References Cited

U.S. PATENT DOCUMENTS

| | | | |
|---|---|---|---|
| 3,775,644 | 11/1973 | Cotner et al. | 324/158 F X |
| 3,777,287 | 12/1973 | Louvel | 333/246 |
| 4,365,195 | 12/1982 | Stegens | 333/246 X |
| 4,535,307 | 8/1985 | Tsukii | 333/35 |
| 4,538,124 | 8/1985 | Morrison | 333/246 |
| 4,547,960 | 10/1985 | Di Troia | 324/158 F X |

FOREIGN PATENT DOCUMENTS 153439  1/1982  German Democratic Rep. .................. 324/158 F Primary Examiner—Eugene R. LaRoche
Assistant Examiner—Benny T. Lee
Attorney, Agent, or Firm—Oblon, Fisher, Spivak, McClelland & Maier

[57] ABSTRACT

A device fixed on a measuring instrument provides access to the terminals of a microwave component in order to measure scattering, noise or output power parameters. In order to minimize the length of connections between the access lines of the device and the input and output terminals of the component to be measured, two access blocks which carry the access lines are positionally adjustable with respect to the component to be measured in such a manner as to permit two degrees of freedom in relative-spacing displacement and in lateral translational displacement. Irrespective of the type of component to be measured (chip, package, or hybrid circuit), the component is carried by an insert block placed between the two access blocks and having dimensions equal to those of the component.

8 Claims, 2 Drawing Sheets

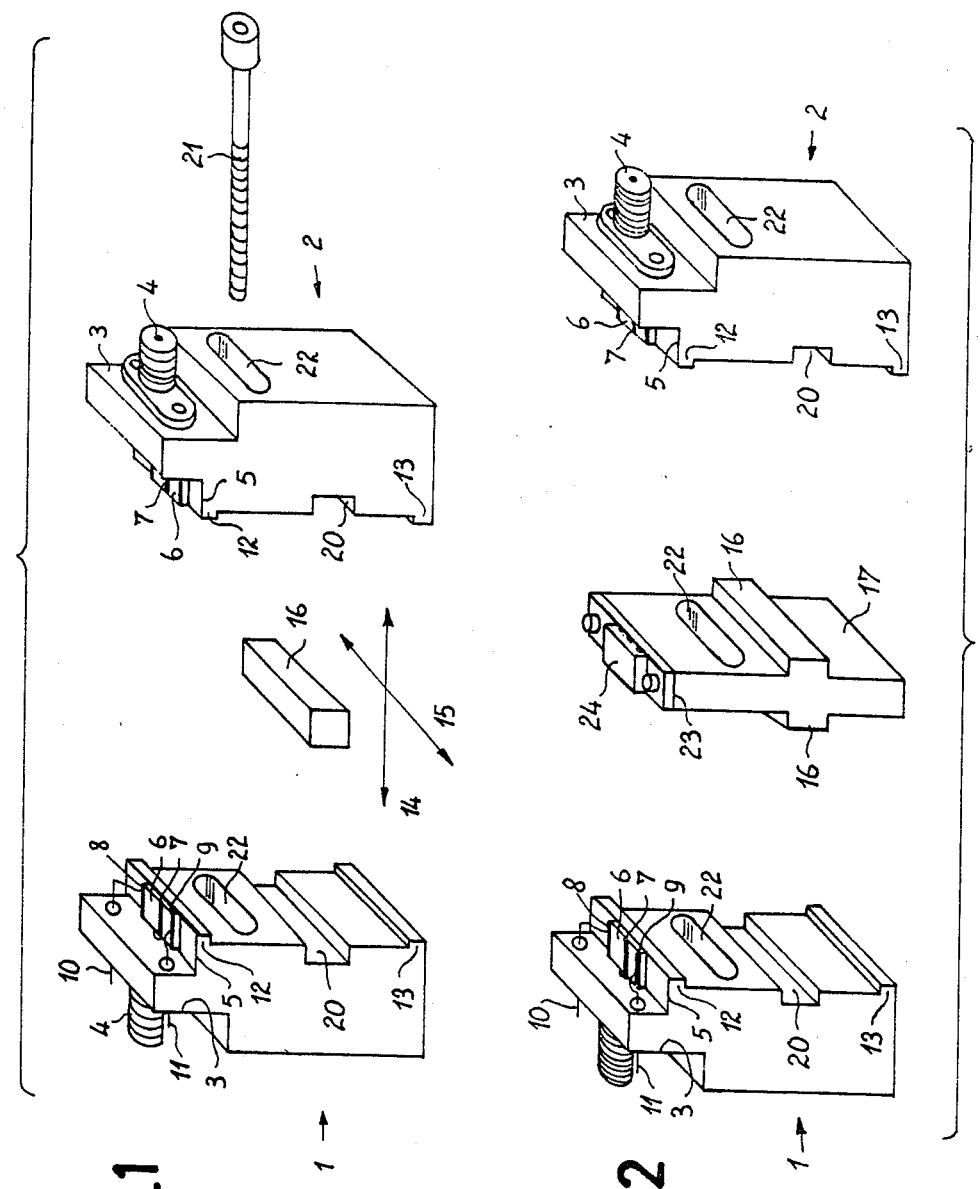

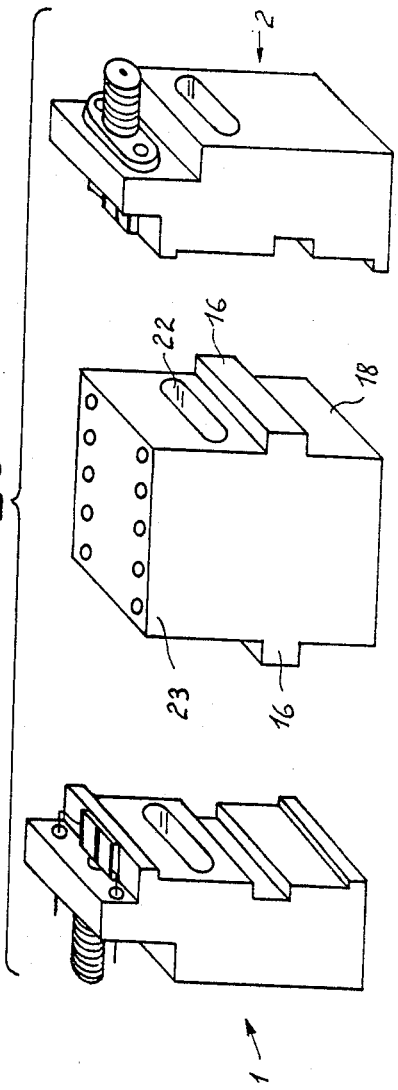
FIG_3
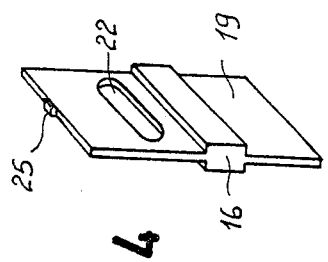
FIG_4

ADJUSTABLE DEVICE FOR MEASURING THE CHARACTERISTICS OF A MICROWAVE COMPONENT

BACKGROUND OF THE INVENTION

1. Field of the Invention

This invention relates to a device for measuring the characteristics of microwave components in the form of chips or discrete packages of integrated circuits and hybrid circuits. This device serves to measure the parameters related to scattering, noise or output power within the range of 2 to 40 GHz.

2. Description of the Prior Art

Any microwave component, whether in the form of a chip of semiconductor material, or in the form of a discrete component (transistor, for example), of an integrated circuit component (amplifier, for example) encapsulated in a package, or in the form of a hybrid circuit mounted on a substrate, must be defined in accordance with predetermined parameters before being put to use. It is a common practice to measure the reflection and transmission parameters or so-called "S" (scattering) parameters, noise and output power parameters. These measurements are made by applying a microwave signal to an input terminal with a matched impedance on an output terminal and by measuring the coefficent of reflection and the gain in the different possible situations if the component has more than two external access terminals. These measurements are well-known to those versed in the art and are performed by means of equipment comprising a test station with the available space for incorporating a circuit to be measured and two input and output connections which are fixed with respect to the measuring device.

It is therefore necessary to have two microstrip lines matched at 50 ohms for the input and output lines and to have lines for polarization of the component during measurement.

For a given type of measuring equipment, there must be as many packages for supporting the component to be measured as there are different types of components: chips, discrete package and, integrated circuit package, hybrid circuit.

Moreover, since the two input and output microstrip lines are in a fixed position on the measuring equipment, it is necessary to establish for each measurement an electrical connection between the input (or output) microstrip and the particular component terminal which corresponds to the measurement performed, but this terminal is not necessarily in alignment with the microstrip to which it is connected. This results in a length of wire or metallic strip which causes mismatching of the microstrip considered, and, in the most unfavorable case, mismatching is liable to occur both at the input and at the output of the component which is being measured.

Measuring devices of the current types therefore have two access connections formed by a coaxial connector and a microstrip which are fixed and separated by a space which also has fixed dimensions. It is necessary to solder wires or strips in order to counteract the fixed character of the measuring device and to choose the terminals on which the measurement is carried out, thus giving rise to a mismatch of the access connections.

OBJECT OF THE INVENTION

It is the object of the measuring device in accordance with the invention to provide a solution to these disadvantages by proposing an improvement whereby the two access connections (coaxial connector + microstrip) are capable of moving along two axes located in the same plane.

SUMMARY OF THE INVENTION

In accordance with the invention, each access connection is rigidly fixed to a solid block which has good electrical conductivity at least at the surface. Each block is adapted to support a microstrip line on a horizontal top face and a coaxial connector. The two blocks are movable and can be relatively spaced to a greater or lesser extent along a first axis parallel to the microstrip lines so as to permit adaptation of the blocks to the geometrical dimensions of the component to be measured. The relative spacing of the blocks is fixed by means of a screw.

In addition, the two blocks are capable of displacement with a predetermined relative spacing by lateral translational motion with respect to each other along a second axis at right angles to the microstrip lines, but in the plane of the microstrips. This second degree of freedom makes it possible:
  first of all to align the input terminal of the component to be measured with the input microstrip line, and
  then to align the output microstrip line with the output terminal of the component to be measured.

The electrical connections to be established are therefore of either zero or minimum length.

A third block is inserted between the two access blocks and is either formed of metal or provided with a surface metallization deposit. This third block serves as a mechanical support for the component to be measured and is provided with means for carrying out the relative movement of lateral translation of the two access blocks with respect to each other in accordance with the second degree of freedom. A set of third blocks serves to adapt the measuring device to the dimensions of different types of components: chips, packages, and hybrid circuit substrates.

In more specific terms, the invention relates to a device for measuring the characteristics of a microwave component in which two lines provide access to the component to be measured, each access line being constituted by a coaxial connector and a microstrip line, this measuring device being distinguished by the fact that two access blocks support the access lines and are positionally adjustable with respect to the component which is to be measured. The component which is to be measured is inserted between the two access blocks, with two degrees of freedom as follows:
  the first degree of freedom provides for relative-spacing displacement along an axis parallel to the microstrip lines and
  the second degree of freedom provides for lateral translational displacement along an axis at right angles to the microstrip lines, but in the plane defined by the microstrip lines.

BRIEF DESCRIPTION OF THE DRAWINGS

FIG. 1 is an exploded view of a device according to the invention in a configuration which permits measurement of its own characteristics (without any component).

FIG. 2 is an exploded view of the same device provided with a first type of component-supporting block.

FIG. 3 is a view which is comparable to FIG. 2, the device being provided with a second type of component-supporting block.

FIG. 4 is a view of the component-supporting block for measuring characteristics on a semiconductor chip.

DETAILED DESCRIPTION OF THE INVENTION

The exploded diagram of FIG. 1 serves to provide a clearer detail view of the two access blocks of the device in accordance with the invention. By way of example, a block 1 constitutes the access block of the input channel, in which case the block 2 is the output channel block. Although the general shape of each block is not of major importance for the operation of the device, the blocks must nevertheless have a certain number of small plane faces, the functions of which will hereinafter be explained in detail. The material used for the fabrication of the access blocks is not critical except that it is important that the surface of the access blocks have good electrical conductivity for good grounding conditions. The access blocks are therefore fabricated either from metal, ceramic material or plastics, and each access block is provided with a surface metallization deposit.

Except for a few details,s the access blocks 1 and 2 are optically symmetrical with respect to the plan of their contact face when they are applied one against the other.

Each access block is provided in an upper portion with a small vertical face 3 on which is fixed a coaxial connector 4 or an equivalent microwave contact connection and on the opposite side, a small horizontal face 5 on which is fixed a wafer 6 of ceramic material such as alumina or beryllium oxide.

Each ceramic wafer 6 carries on its apparent principal face a microstrip 7 in alignment with the central conductor of the coaxial connector 4. The dimensions and thickness of the wafer 6 are calculated so as to ensure that the microstrips 7 are impedance-mated at 50 ohms (standardized value) between 2 and 40 GHz. The microstrips 7 are each soldered to the central conductor of the corresponding coaxial connector 4. At least one of the two ceramic wafers 6 supports two metallization deposits 8 and 9 of any suitable shape. Each metallization deposit 8, 9 is connected by a lead-wire to a corresponding connection 10 and 11 which is fixed in the corresponding access block 1, 2 by means of a glass bead. The two connections 10 and 11 and the two metallization deposits 8 and 9 can be used to apply a bias voltage to the component to be measured.

Each access block 1 and 2 is provided in addition with two lips 12 and 13 so arranged as to project from the opposite faces of the two blocks. When the access blocks 1, 2 are tightly applied against each other, the lips 12 and 13 ensure good electrical continuity of the ground plane.

From a mechanical standpoint, the two blocks have a first degree of freedom in relative-spacing displacement along the axis which is common to the microstrips 7 and to the coaxial central conductors of the connectors 4. This common axis is represented by an arrow 14 in FIG. 1. The blocks can be relatively spaced either at a zero distance as is the case in FIG. 1 for measurement of characteristics which are specific to the device alone or at a distance imposed by the dimensions of the component to be measured. In this case, a component-supporting block is inserted between the two access blocks 1 and 2. Insert blocks of this type as designated by the reference numerals 17, 18 and 19 are illustrated in FIGS. 2, 3 and 4 and will be described in detail hereinafter.

The access blocks 1 and 2 are provided in addition with a second degree of freedom in lateral translational displacement along an axis at right angles to the microstrips 7 in the plane of the wafers 6. This axis is represented by an arrow 15. Lateral displacement of the access block 1 with respect to the access block 2 is controlled by a system constituted by a channel 20 formed in each of the two access blocks 1 and 2 and adapted to cooperate with a rail 16. As will readily be apparent, the channels 20 are machined in the opposite faces of the access blocks 1 and 2 in a direction parallel to the axis of the second degree of freedom.

Depending on their dimensions, the insert blocks 17, 18 and 19 are each provided with either one rail 16 or with two half-rails 16 (see FIGS. 2, 3, and 4) on the faces located opposite to the access blocks 1 and 2.

When an access block 1, an insert block 17, 18, or 19, and an access block 2 have been assembled together, a translational displacement along the rail 16 makes it possible to place the input microstrip 7 in coincident relation with the particular input terminal which has been selected on the component to be measured and to place the output microstrip 7 in coincident relation with the particular output terminal which has been selected on the component to be measured. When this double coincidence is obtained, the complete assembly is immobilized by clamping by means of a screw 21 which is passed through elongated slots 22 formed in the three blocks so as to permit lateral displacement.

Before proceeding further with the description of the device in accordance with the invention, it will be of interest to indicate the calibration measurements in standing-wave losses and ratios carried out on the device alone without any component and as illustrated in FIG. 1 (although it will be understood that the device is in a state in which the access blocks 1, 2 are clamped together by means of the screw 21). The two microstrips 7 are joined together by heat-sealing, and the lips 12 and 13 are indirect contact. Three scalar measurements are then performed on the measuring device without any component.

By applying the input microwave signal to a coaxial connector 4, the losses of the device including the connectors can be measured by collecting this signal on the output coaxial connector 4. This signal serves to determine the intrinsic losses of the device, and it is stored them in memory.

Calibration in standing-wave ratios is carried out in two steps, assuming that the two access blocks are identical. A first measurement is made in open circuit on a separate access block (it is therefore no long screwed on the other access block) whilst the microstrip 7 is not connected to a load. In a second measurement in short-circuit, the 50-ohm microstrip 7 is connected to ground at the end of the line, and a wire is soldered between the end of the microstrip 7 and the access block 1 or 2.

On completion of this calibration, an insert block such as the block 17 in FIG. 2 can be inserted between the two access blocks 1 and 2. This insert block 17 is intended to support a component 24 to be tested and is essentially distinguished by the following features:

the insert block is electrically conductive at least at the surface thereof so as to ensure continuity of the ground plane with the access blocks 1 and 2;

the block has a small top face 23 the dimensions of which are the same as those of the component 24 which is fixed thereon;

each insert-block face located opposite to the access blocks has a rail 16 which is adapted to cooperate with the channels 20 in the access blocks; and the insert block has an elongated slot 22 for the insertion of the screw 21.

Vectorial measurements serve to determine the "S" parameters of the access blocks 1 and 2. To this end, a 50-ohm line is fixed on the insert block 17. This makes it possible to vary the phases of a microwave signal applied to a coaxial connector 4.

A component 24 to be tested is then fixed on the small top face 23 of the insert block 17 instead of the 50-ohm line. When the microstrips 7 and input and output terminals of the component 24 are in coincident relation, the screw 21 is tightened-up, and the electrical connections are made by thermocompression of the wires or strips of very small length on the microstrips 7 and on the polarization metallization deposits 8 and 9. The "S" parameters of the component are extracted by computation of the global measurement in accordance with the known method referred-to-as "de-embedding," which need not be discussed here.

The insert block 17 of FIG. 2 corresponds to a component 24 mounted within a rectangular casing or so-called package. In some cases, it may prove necessary to employ a plurality of components in series such as, for example, amplifiers mounted in series in order to achieve higher gain, in which case an insert block 18 will be used as shown in FIG. 3. Alternatively, a semiconductor component chip 25 may be measured by means of the insert 19 of FIG. 4. Other designs of inserts can be provided according to the dimensions of the component to be measured. In all cases, however, the small top face 23 of the insert block is located in the plane of the small horizontal faces 5 of the access blocks 1 and 2 and has dimensions such that the input and output terminals of the component are level with the free end of the microstrips 7, with the result that the junction wire to be thermocompressed is of minimum length.

It will be observed that this result is obtained by reason of the fact that the two access blocks 1 and 2 enjoy two degrees of freedom, thus making it possible to bring the microstrips 7 into coincident relation with the component terminals selected for the measurement.

The construction of the device for measuring microwave characteristics can assume forms other than those hereinabove described by way of explanation without thereby departing either from the scope of the invention or from the spirit of the appended claims.

What is claimed is:

1. A device for measuring the characteristics of microwave components, said device comprising:
   (a) a first access block having a first side and a second side, at least the second side of said first access block being electrically conductive;
   (b) a second access block having a first side and a second side, at least the first side of said second access block being electrically conductive, the first side of said second access block facing the second side of said first access block;
   (c) a first coaxial connector projecting from a first face on the first side of said first access block;
   (d) a second coaxial connector projecting from a second face on the second side of said second access block;
   (e) a first ceramic wafer disposed on a third face on the second side of said first access block;
   (f) a second ceramic wafer disposed on a fourth face on the first side of said second access block;
   (g) a first microstrip formed on said first ceramic wafer, said first microstrip being in electrical contact with the central conductor of said first coaxial connector;
   (h) a second microstrip formed on said second ceramic wafer, said second microstrip being in electrical contact with the central conductor of said second coaxial connector; and
   (i) a plurality of insert blocks, each one of said plurality of insert blocks being sized and shaped so that it can be individually held between the second side of said first access block and the first side of said second access block and to support a microwave component, the characteristics of which are to be measured, in register with said first and second microstrips, said plurality of insert blocks differing in thickness, wherein:
   (j) the positional relationship of said first and second access blocks is adjustable in a first direction depending on the thickness of the one of said plurality of insert blocks held between the second side of said first access blocks an the first side of said second access blocks;
   (k) the positional relationship of said first and second access blocks is adjustable in a second direction, perpendicular to the first direction, by movement of said first and second access blocks relative to the one of said plurality of insert blocks held between the second side of said first access block and the first side of said second access block; and
   (l) said first and second access blocks and the one of said plurality of inset blocks held between the second side of said first access block and the first side of said second access block can be held in a positional relationship selected so that said first and second microstrips are in register with the microwave component.

2. A device as recited in claim 1 wherein each one of said plurality of insert blocks has a fifth face which is coplanar with said third and fourth faces when said each one of said plurality of insert blocks is individually held between the second side of said first access block and the first side of said second access block.

3. A device for measuring the characteristics of microwave components, said device comprising:
   (a) a first access block having a first side and a second side, a first electrically conductive lip being formed on the second side of said first access block;
   (b) a second access block having a first side and a second side, a second electrically conductive lip being formed on the first side of said second access block in position to be in electrical contact with said first electrically conductive lip when said first and second access blocks are in contact;
   (c) a first coaxial connector projecting from the first side of said first access block;
   (d) a second coaxial connector projecting from the second side of said second access block;

(e) a first microstrip formed on the second side of said first access block;

(f) a second microstrip formed on the first side of said second access block; and (g) a plurality of insert blocks, each one of said plurality of insert blocks being sized and shaped so that it can be individually held between the second side of said first access block and the first side of said second access block and to support a microwave component, the characteristics of which are to be measured, in register with said first and second microstrips, said plurality of inset blocks differing in thickness, wherein:

(h) the positional relationship of said first and second access blocks is adjustable in a first direction depending on the thickness of the one of said plurality of insert blocks held between the second side of said first access block and the first side of said second access blocks;

(i) the positional relationship of said first and second access blocks is adjustable in a second direction, perpendicular to the first direction, by movement of said first and second access blocks relative to the one of said plurality of insert blocks held between the second side of said first access block and the first side of said second access block; and (j) said first and second access blocks and the one of said plurality of insert blocks held between the second side of said first access block and the first side of said second access block can be held in a positional relationship selected so that said first and second microstrips are in register with the microwave component.

4. A device for measuring the characteristics of microwave components, said device comprising:

(a) a first access block having a first side and a second side, a first channel being formed in the second side of said first access block;

(b) a second access block having a first side and a second side, a second channel being formed in the first side of said second access block, the first side of said second access block facing the second side of said first access block;

(c) a first coaxial connector projecting from a first face on the first side of said first access block;

(d) a second coaxial connector projecting from a second face on the second side of said second access block;

(e) a first microstrip formed on the second side of said first access block;

(f) a second microstrip formed on the first side of said second access block; and (g) a plurality of insert blocks differing in thickness, each one of said plurality of inset blocks;

(i) being sized and shaped so that it can be individually held between the second side of said first access block and the first side of said second access block;

(ii) having a first rail sized and shaped to be received slidingly in said first channel and a second rail sized and shaped to be received slidingly in said second channel; and (iii) being sized and shaped to support a microwave component, the characteristics of which are to be measured, in register with said first and second microstrip, wherein:

(h) the positional relationship of said first and second access blocks is adjustable in a first direction depending on the thickness of the one of said plurality of insert blocks held between the second side of said first access block and the first side of said second access blocks;

(i) the positional relationship of said first and second access block is adjustable in a second direction, perpendicular to the first direction, by movement of said first and second rails on the one of said plurality of insert blocks held between the second side of said first access block and the first side of said access block in said first and second channels; and (j) said first and second access blocks and the one of said plurality of insert blocks held between the second side of said first access block and the first side of said second access block can be held in a positional relationship selected so that said first and second microstrips are in register with the microwave component.

5. A device for measuring the characteristics of microwave components, said device comprising:

(a) a first access block having a first side and a second side;

(b) a second access block having a first side and a second side, the first side of said second access block facing the second side of said first access block;

(c) a first coaxial connector projecting from the first side of said first access block;

(d) a second coaxial connector projecting from the second side of said second access block;

(e) a first microstrip formed in the second side of said first access block;

(f) a second microstrip formed on the first side of said second access block; and (g) a plurality of insert blocks, each one of said plurality of inset blocks being sized and shaped so that it can be individually held between the second side of said first access block and the first side of said second access block and to support a microwave component, the characteristics of which are to be measured, in register with said first and second microstrips, said plurality of insert blocks differing in thickness, wherein:

(h) the positional relationship of said first and second access blocks is adjustable in a first direction depending on the thickness of the one of said plurality of insert blocks held between the second side of said first access block an the first side of said second access blocks;

(i) the positional relationship of said first and second access blocks is adjustable in a second direction, perpendicular to the first direction, by movement of said first and second access blocks relative to the one of said plurality of insert blocks held between the second side of said first access block and the first side of said second access block; and (j) said first and second access blocks and the one of said plurality of insert blocks held between the second side of said first access block and the first side of said second access block can be held in a positional relationship selected so that said first and second microstrips are in register with the microwave component.

6. A device as recited in claim 5 wherein:

(a) a first channel is formed in the second side of said first access block;
(b) a second channel is formed on the first side of said second access block; and
(c) each one of said plurality of insert blocks has a first rail sized and shaped to be received slidingly in said first channel and a second rail sized and shaped to be received slidingly in said second channel.

7. A device as recited in claim 5 wherein said first access block, said second access block, and each one of said plurality of insert blocks is provided with an elongated slot for passing a clamping screw through each block in order to lock them in position.

8. A device for measuring the characteristics of microwave components, said device comprising:
   (a) a first access block having a first side and a second side;
   (b) a second access block having a first side and a second side, the first side of said second access block facing the second side of said first access block;
   (c) a first coaxial connector projecting from the first side of said first access block;
   (d) a second coaxial connector projecting from the second side of said second access block;
   (e) a first microstrip formed in the second side of said first access block;
   (f) a second mircostrip formed on the first side of said second access block;
   (g) a plurality of insert blocks, each one of said plurality of insert blocks being sized and shaped so that it can be individually held between the second side of said first access block and the first side of said second access block and to support a microwave component, the characteristics of which are to be measured, in register with said first and second mircostrips, said plurality of insert blocks differing in thickness; and
   (h) means for applying a bias voltage to the microwave component,
wherein:
   (i) the positional relationship of said first and second access blocks is adjustable in a first direction depending on the thickness of the one of said plurality of insert blocks held between the second side of said first access block and the first side of said second access blocks;
   (j) the positional relationship of said first and second access blocks is adjustable in a second direction, perpendicular to the first direction, by movement of said first and second access blocks relative to the one of said plurality of insert blocks held between the second side of said first access block and the first side of said second access block; and
   (k) said first and second access blocks and the one of said plurality of insert blocks held between the second side of said first access block and the first side of said second access block can be held in a positional relationship selected so that said first and second microstrips are in register with the microwave component.

* * * * *